United States Patent
Luo et al.

(10) Patent No.: US 9,000,786 B2
(45) Date of Patent: Apr. 7, 2015

(54) METHODS AND SYSTEMS FOR DEFECTIVE PHASE IDENTIFICATION AND CURRENT SENSE CALIBRATION FOR MULTI-PHASE VOLTAGE REGULATOR CIRCUITS

(71) Applicants: Shiguo Luo, Austin, TX (US); Philip B. Geiger, Round Rock, TX (US)

(72) Inventors: Shiguo Luo, Austin, TX (US); Philip B. Geiger, Round Rock, TX (US)

(73) Assignee: Dell Products LP, Round Rock, TX (US)

( * ) Notice: Subject to any disclaimer, the term of this patent is extended or adjusted under 35 U.S.C. 154(b) by 120 days.

(21) Appl. No.: 13/768,357

(22) Filed: Feb. 15, 2013

(65) Prior Publication Data

US 2014/0232420 A1 Aug. 21, 2014

(51) Int. Cl.
*G01R 31/00* (2006.01)
*G06F 1/26* (2006.01)
*H02M 3/158* (2006.01)
*G01R 31/40* (2014.01)

(52) U.S. Cl.
CPC ............... *G06F 1/26* (2013.01); *H02M 3/1584* (2013.01); *G01R 31/40* (2013.01)

(58) Field of Classification Search
USPC ............ 324/537, 500, 750.01, 521, 600, 617, 324/622, 683, 709, 66
See application file for complete search history.

(56) References Cited

U.S. PATENT DOCUMENTS

| | | | |
|---|---|---|---|
| 6,281,666 B1 | 8/2001 | Tressler et al. | |
| 6,674,274 B2 | 1/2004 | Hobrecht et al. | |
| 7,294,976 B1 | 11/2007 | Andric et al. | |
| 7,298,601 B2 | 11/2007 | Covi et al. | |
| 7,383,145 B2 | 6/2008 | Tabaian et al. | |
| 7,414,383 B2 | 8/2008 | Burton et al. | |
| 7,804,733 B2 | 9/2010 | Alexander et al. | |
| 7,999,520 B2 | 8/2011 | Luo et al. | |
| 2002/0135338 A1 | 9/2002 | Hobrecht et al. | |
| 2006/0001408 A1 | 1/2006 | Southwell et al. | |
| 2008/0162963 A1 | 7/2008 | Kung et al. | |
| 2008/0169797 A1 | 7/2008 | Zambetti et al. | |
| 2008/0238390 A1 | 10/2008 | Trivedi et al. | |
| 2010/0148808 A1* | 6/2010 | Butler ........................... | 324/754 |
| 2010/0320977 A1* | 12/2010 | Qiu et al. ...................... | 323/272 |
| 2011/0051479 A1 | 3/2011 | Breen et al. | |
| 2011/0080151 A1 | 4/2011 | Rahardjo et al. | |

OTHER PUBLICATIONS

St, "High Current Mosfet Driver", L6747B, Rev. 0.90, Jan. 2009, 16 pgs.

* cited by examiner

*Primary Examiner* — Melissa Koval
*Assistant Examiner* — Trung Nguyen
(74) *Attorney, Agent, or Firm* — Egan, Peterman & Enders LLP (57) ABSTRACT

Methods and systems are disclosed that may be implemented to complete individual phase current sense calibration of a multi-phase voltage regulator (VR) and/or to detect any and all individual bad phases of such a VR by utilizing the reconfiguration capability of a digital VR controller-based VR in conjunction with an improved test process. The disclosed systems and methods may be employed in one example to identify that all individual phases of the multi-phase VR are operational to contribute to the output of the multi-phase VR using a rotating single phase operation testing mode. Individual phase current sense calibration may also be additionally or alternatively completed while the VR is operating under the rotating single phase operation mode.

20 Claims, 4 Drawing Sheets

METHODS AND SYSTEMS FOR DEFECTIVE PHASE IDENTIFICATION AND CURRENT SENSE CALIBRATION FOR MULTI-PHASE VOLTAGE REGULATOR CIRCUITS

FIELD OF THE INVENTION

This application relates to information handling systems, and more particularly to multi-phase voltage regulator (VR) circuitry.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

High current information handling system loads, such as for CPU's and memory, typically require multi-phase voltage regulators (VR's). A power stage phase of each VR phase is usually composed of a MOSFET (metal oxide semiconductor field effect transistor) driver, a high-side MOSFET, a low-side MOSFET and an inductor with all the phase inductors being tied together at their output. One example of such a multi-phase VR architecture may be found in U.S. Pat. No. 7,999,520. Because the multiple power phases of such a multi-phase VR are tied together, it makes identification of an individual bad power phase (or phase) difficult, as the failure could be occurring on any one or more of the power phases. As used herein, a bad power phase is defined as a non-working power phase that is incapable of delivering power from input to the output. Such a bad power phase may be caused, for example, by poor soldering (open or short circuit) or a bad/missing component. Thus, if one of the individual power phases is not working, the entire VR may still appear to be functioning normally during manufacturing and testing, even though the VR may not be able to supply sufficient load current for the information handling system load it is designed to power. In such a case, a defective VR power phase may not be identified during the manufacturing process for an information handling system and may operate properly for powering a lower initial system power load. However, the defective power phase may later cause system malfunction or shut-down in a field installation when additional system power load is added to the system, e.g., during a reconfiguration of the system by a user.

In circuit test (ICT) is a method for testing VR circuitry early during the printed circuit board (PCB) assembly process in an attempt to diagnose circuit failures down to the faulty component pin level. ICT is a method of testing PCB assemblies (PCBAs) that can detect solder shorts and that examines each component on the PCBA individually for correct value and orientation by electrically isolating it from all other components on the board. In order to accomplish this, a "bed-of nails" test fixture is used to provide an interface between every electrical node on the PCBA and the test system voltage source and measurement electronics.

However, current conventional ICT test equipment and procedures cannot identify a bad VR power phase in an example such as described above for several reasons. First, solder joint issues (e.g., such as too much wicking area) cannot be found by ICT because ICT is an electrical test and only optical inspection can find bad solder joints, unless the defect is one that causes shorts to another node or a high impedance (i.e. open) circuit. Second, not all nodes for VR circuitry are verified for open and short circuits by the ICT fixture due to limited access to VR nodes. This is due to issues with impedance loading of the nets by the ICT fixture. Nodal access can also be limited due to space and circuit complexity issues. Third, ICT can simulate proper power sequencing and verify that the output voltage of a VR is correct. However, a bad phase cannot be identified if phase1 in a multi-phase VR is operating normally. In most cases, only phase1 is operating during ICT test for a multiphase VR with auto phase shedding feature since there is no substantial load being applied during the ICT test. As such, other VR phases cannot be validated by ICT. Thus, a defective VR will be incorrectly recognized as operational as long as phase1 is working normally and the value of Vout is within nominal tolerances when measured.

SUMMARY OF THE INVENTION

Disclosed herein are methods and systems that may be implemented to complete individual phase current sense calibration of a multi-phase voltage regulator (VR) and/or to detect any and all individual bad phases of such a VR by utilizing the reconfiguration capability of a digital VR controller-based VR in conjunction with an improved test process. The disclosed systems and methods may be employed in one embodiment to identify that all individual phases of the multi-phase VR are operational to contribute to the output of the multi-phase VR using a rotating single phase operation testing mode. Individual phase current sense calibration may also be completed while the VR is operating under the rotating single phase operation mode.

In one embodiment, the disclosed systems and methods may be employed to use ICT testing to identify that all individual phases of the multi-phase VR are operational to contribute to the output of the multi-phase VR using a rotating single phase operation mode. Individual phase current sense calibration may also be completed while the VR is operating under the rotating single phase operation mode during ICT testing. Since under the disclosed ICT testing, the VR has only one phase operating in steady-state mode at a time, a reduced maximum load is required at any given time from an ICT fixture to complete the total CPU operating current calibration (e.g., only a 30 Amp maximum load is required at any given time from the ICT test fixture to calibrate a single phase at a time versus a 180 Amp CPU Imon calibration load required to calibrate all phases of a six-phase VR at the same time). Thus, larger diameter ICT test pads on the tested PCBA are not required to handle the full 180 Amp CPU load for all phases since only the reduced single phase 30 Amp current load is required at any given time from the ICT fixture rather than the total (all phases) 180 Amp current value which would otherwise be required for calibration. Moreover, the disclosed methods and systems may be employed to better optimize CPU operation by providing more accurate monitoring current (Imon) telemetry than traditional inductor DCR current sense (CS) methodology without calibration and thus allow maximization of the important energy efficiency specification of performance per watt, e.g., for server applications.

The disclosed methods and systems may be advantageously implemented to identify more than one bad VR phase during a given time or during a given ICT test procedure by using communication bus (e.g., PMBus) commands to a digital VR controller to reconfigure the number of phases for a VR under test. Thus the disclosed methods and systems may take advantage of the reconfiguration capability of a digital controller-based VR to provide a reliable approach to identify whether all VR phases are good or bad by verifying if each individual phase is contributing to output of a multiphase VR. In one exemplary embodiment, the disclosed methods and systems may be implemented to realize significant time savings (e.g., by original design manufacturers "ODMs") to troubleshoot failed boards by identifying multiple bad phases of a multi-phase VR during the same fault diagnosis ICT test mode, and advantageously before additional product assembly (e.g., early in the PCBA assembly process) and/or before shipping the multi-phase VR circuitry device out to a user (e.g., as part of an information handling system) or to an assembler of information handling systems. Advantageously, the disclosed systems and methods may be so implemented in order to test multi-phase VR devices that are configured to meet increased power density demands which have smaller package power devices and shorter pin-pin pitch components. Denser VR component usage in such VR devices increases chance of potential soldering problems and therefore makes more important the identification of a bad phase during the manufacture process and before shipping the device out with an information handling system to an end user.

In one respect, disclosed herein is a method of testing a multi-phase voltage regulator (VR) having multiple phases. The method may include the steps of controlling the multi-phase VR to individually enable at least one of the multiple phases of the multi-phase VR by itself to produce an output voltage for a duration of time from the individually enabled phase alone; analyzing the separate individual output of the individually enabled phase; and at least one of: determining if the analyzed separate output from the individually phase meets a predetermined phase output criteria, or performing phase current sense calibration for the individually enabled phase based on the analyzed separate output from the individually enabled phase, or a combination thereof.

In another respect, disclosed herein is a test system configured to test a multi-phase VR having multiple individual phases. The test system may include: a test system voltage source configured to be coupled to provide power to a voltage input of the multiple phases of the multi-phase VR; a test system load configured to be coupled to a voltage output of the multiple phases of the multi-phase VR; and a test system controller configured to be coupled to provide test system control signals to the multi-phase VR. The test system controller may be configured to provide test system control signals to the multi-phase VR to cause the multi-phase VR to individually enable at least one of the multiple phases of the multi-phase VR by itself to produce an output voltage to the test system load for a duration of time from the individually enabled phase alone. The test system controller may be further configured to analyze the individual output of the individually enabled phase to at least one of: determine if the analyzed separate output from the individually enabled phase meets a predetermined phase output criteria, or perform phase current sense calibration for the individually enabled phase based on the analyzed separate output from the respective individually enabled phase, or a combination thereof.

DESCRIPTION OF ILLUSTRATIVE EMBODIMENTS

Figure 1:
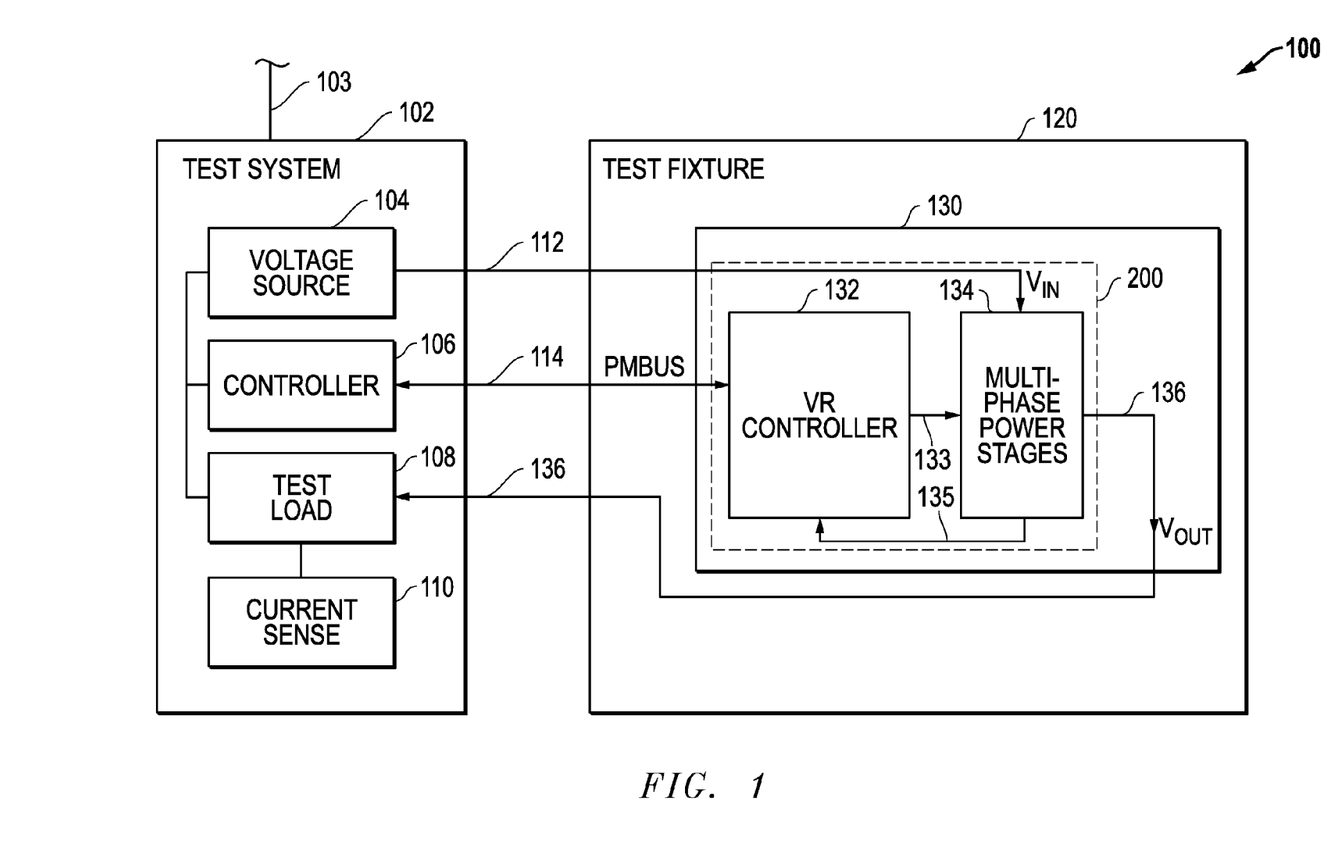
FIG. 1 is a block diagram illustrating a test configuration according to one exemplary embodiment of the disclosed methods and systems.

FIG. 1 is a block diagram illustrating one exemplary embodiment of a test configuration 100 as it may be implemented to test and/or calibrate multi-phase VR circuitry device 200 on any board or system having multi-phase VR circuitry, e.g., to detect any and all individual bad phases of the multi-phase VR and/or to perform individual phase current sense calibration of the multi-phase VR. Possible examples of such multi-phase VR circuitry include, but are not limited to, VR circuitry on a PCBA (e.g., such as a motherboard) or other electrical assembly unit (e.g., such as a PSU). In one exemplary embodiment of FIG. 1, the multi-phase VR may include a digital VR controller 132 that is coupled on a PCBA 130 to control the individual power phases 134 of the VR 200 using phase control signals 133 that may be, for example, a plurality of enable (EN*) signals and pulse width modulation (PWM) signals as will be described further herein. Voltage and current sensing signals 135 may be provided as shown from power phases 134 to VR controller 132. As shown, PCBA 130 may be received in an ICT test fixture 120 which may be, for example, a bed of nails test fixture having pins configured for alignment with appropriate test pads provided on the PCBA 130 that are coupled to VR controller and power phase circuit components of the VR in a manner to allow the testing methodology described further herein. It will be understood that a test system 100 may alternatively be configured to to test and/or calibrate multi-phase VR circuitry device/s on any other type of board or system 130 having multi-phase VR circuitry.

It will be understood that the embodiment of FIG. 1 is exemplary only, and that any other test system configuration suitable for exchanging digital communication signals and/or voltage signals to accomplish the disclosed testing methodology may be employed, e.g., such as boundary scan techniques, etc. Moreover, any suitable manner of temporarily coupling between a test system and a multi-phase VR for testing may be employed that allows decoupling of the VR and test system components from each other that allows the multi-phase VR to be separated intact from the test system and used for its intended purposes (e.g., installation in a separate information handling system such as server, desktop computer, notebook computer, PDA, cell phone, etc.) following testing. Examples of manners for such temporary coupling include, but are not limited to, pins and corresponding test pads, test cables/connectors, etc.

Still referring to the exemplary embodiment of FIG. 1, test system 102 includes a voltage source 104 coupled to provide an input voltage 112 to power phases 134 of PCBA 130 via test fixture 120. However, it will be understood that it is possible that such a voltage source may be alternatively provided within test fixture 120 to place the voltage source closer to multi-phase VR circuitry device 200, e.g., to minimize chance for occurrence of additional spikes during high current operation or transient. Test system 102 also includes a test load 108 (represented in FIG. 2 by current source and capacitor) that is coupled to receive the output voltage 136 from power phases 134 via test fixture 120 as shown. Test load 108 may be configured to operate in a manner in which output can be adjusted at a preset current value as a VR load. Current sense circuitry 110 is also provided as part of test system 102 for purposes of providing accurate current measurement as a reference for calibration by comparing measured current from current sense circuitry 110 with monitored current by VR controller 132. As further shown, test system includes a test system controller 106 (e.g., a processing device such as controller, microcontroller, processor, microprocessor, FPGA, ASIC, etc.) that is configured to provide test system control signals via a digital communication bus 114, e.g., such as I²C or a power management bus "PMBus", system management bus "SMBus", etc.

As further shown in FIG. 1, test system 102 may be communicatively coupled (e.g., across a suitable network communication medium or connection 103) to communicate multi-stage VR test results from the test system controller 106 to external processing device/s or system/s, e.g., such as a test data collection system at a PCBA manufacturer site that controls quality for the production line.

Figure 2:
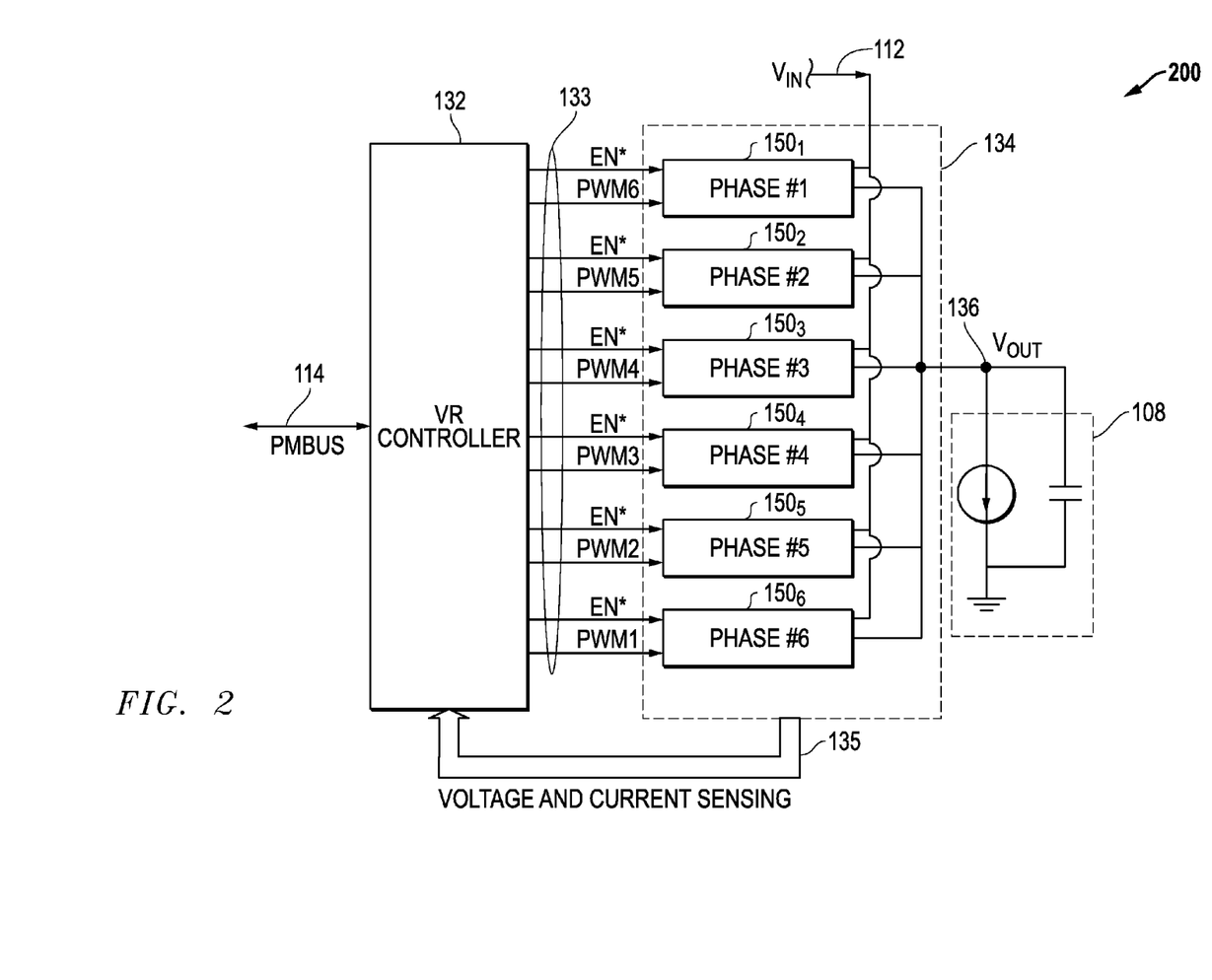
FIG. 2 illustrates a multi-phase VR according to one exemplary embodiment of the disclosed methods and systems.
Figure 3:
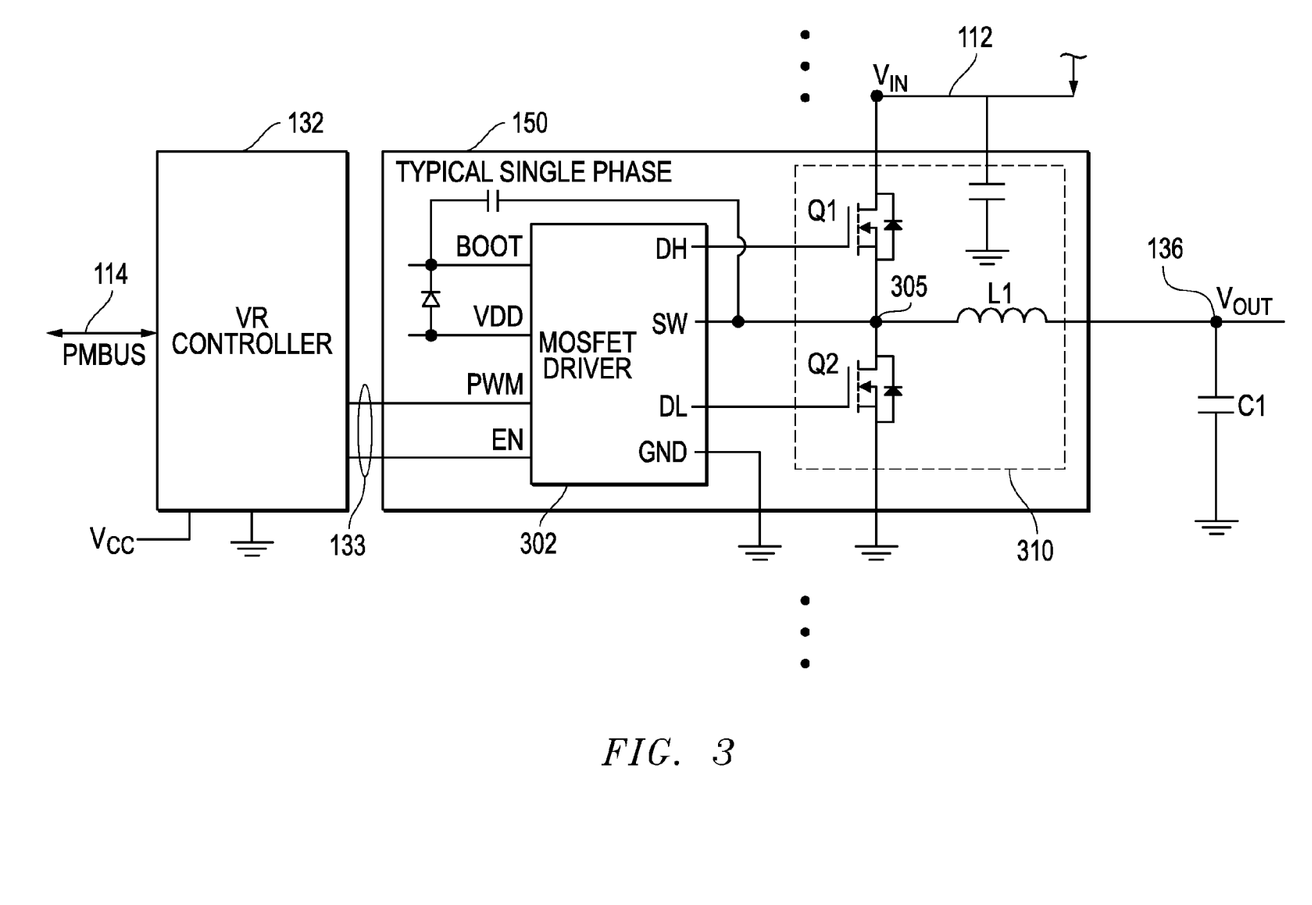
FIG. 3 illustrates a single phase of a multi-phase VR according to one exemplary embodiment of the disclosed methods and systems.

FIG. 2 illustrates one exemplary embodiment of a multi-phase VR 200 such as may be provided on PCBA 130 of FIG. 1. As shown, VR 200 includes a digital VR controller 132 that is coupled to six power phases $150_1$-$150_6$ to drive them as a multi-phase VR using phase control signals 133 in the form of a plurality of enable (EN*) signals and pulse width modulation (PWM) signals. In this regard, VR controller 132 may be coupled to control each power phase 150 via a corresponding MOSFET switching device driver 302 that may be integrated within each power phase 150 as shown in FIG. 3. When ultimately installed to power one or more components of an information handling system that may vary in power requirement, one or more of the six power phases may be selectably enabled in order to provide power according to the actual power requirements of the system load (e.g., such as a system CPU). For example, all six phases may be used to provide a highest system load power level, only four phases may be used to power a relatively lower system load power level, only three phases may be used to power an even lower system load power level, etc. Further information on multi-stage VR configuration and operation may be found, for example, described in U.S. Pat. No. 7,999,520, which is incorporated herein by reference in its entirety.

Also shown in FIG. 2 are input voltage 112 provided from voltage source 104 of test system 102 to power phases 134 during test, and output voltage 136 which is in turn provided from power phases 134 to test load 108 during test according to test system control signals provided from test system 102 via digital communication bus 114. Voltage and current sensing signals 135 are also shown provided from power phases 134 to VR controller 132.

FIG. 3 illustrates one exemplary embodiment of a single phase 150 of multi-phase VR 200 of FIG. 2 as it may be operatively coupled to communication bus 114, input voltage 112 and output voltage 136 as previously described. As shown, each power phase includes a MOSFET driver 302 and power stage circuitry 310. The MOSFET driver 302 of each phase 150 receives a regulated power supply $V_{DD}$ and provides driving signals to MOSFET gates of the corresponding power stage 310 as shown. The power stage 310 includes a first MOSFET (Q1) that is driven by the DH signal, a second MOSFET (Q2) that is driven by the DL signal, and an inductor L1 that is connected between phase node 305 (SW) and output terminal Vout 136. The first MOSFET (Q1) is coupled between a voltage input 112 and node 305. The second MOSFET (Q2) is coupled between phase node 305 and ground (GND), and an inductor L1 is coupled between phase node 305 and the output voltage node (Vout) 136. VR controller 132 receives a separate power supply $V_{CC}$ and operates to control the MOSFET driver 302 with control signals 133 previously described. VR controller also has a ground connection. It is noted that $V_{CC}$ and $V_{DD}$ are bias power supplies for the VR controller 132 and MOSFET driver 302, respectively, and these power supplies may be drawn from the voltage input (Vin) 112 or from different voltage source, as desired. In one exemplary embodiment, MOSFET driver 302 may get a Boot voltage from a bootstrap branch (e.g., including diode and a capacitor as shown) via phase node 305 and VDD for purposes of providing drive bias to MOSFET Q1. Drive bias for Q1 should be higher than Vin 112, as desired when Q1 is turn on.

Figure 4:
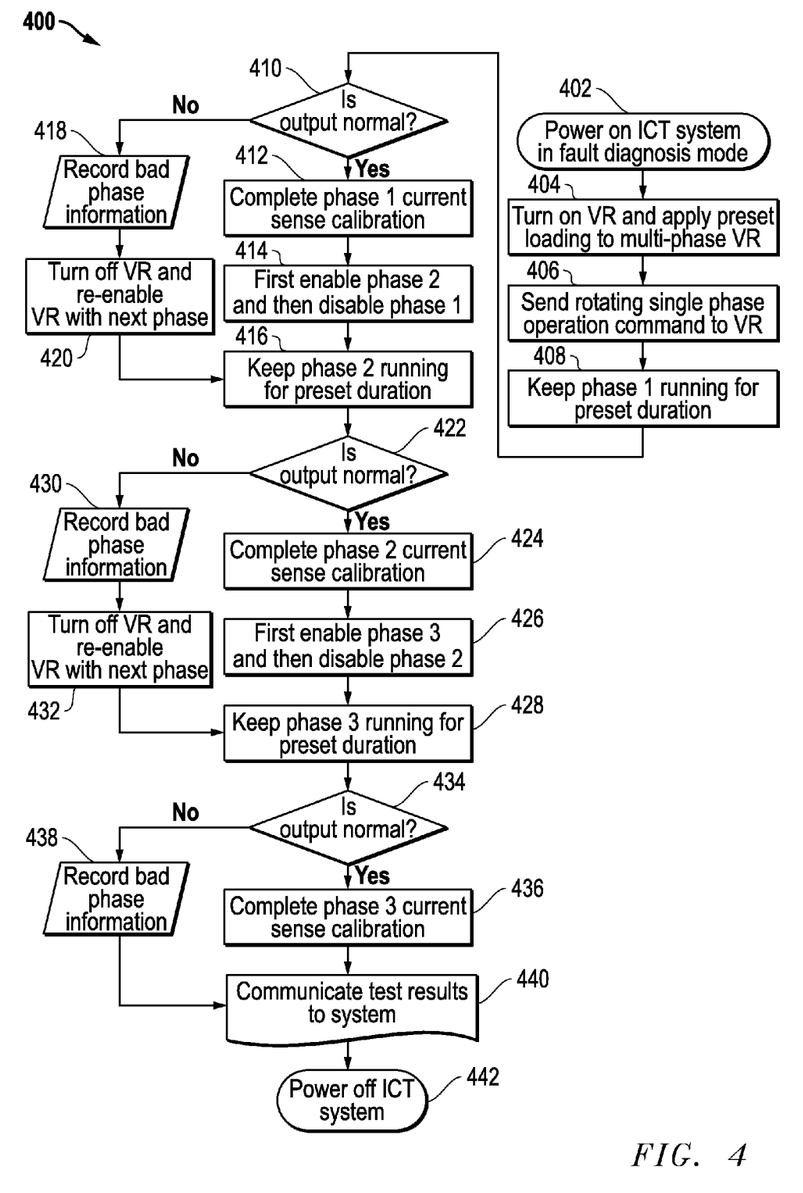
FIG. 4 illustrates methodology that may be implemented according to one exemplary embodiment of the disclosed methods and systems.

FIG. 4 illustrates one exemplary embodiment of a rotating single phase operation mode methodology 400 that may be employed by a test system (such as test system 100 of FIG. 1) to confirm that all phases of a multi-phase VR (such as six-phase VR 200 of FIG. 2) are properly operational and, if not, to identify one or more bad or defective phases of the multi-phase VR. At the same time, methodology 400 may also be implemented to perform phase current sense calibration for each individual phase of the multi-phase VR. In this regard, methodology 400 is described as follows in relation to the ICT-based system embodiment of FIG. 1 and assuming a three-phase multi-phase VR otherwise implemented in the same manner as the six phase multi-phase VR 200 of FIG. 2, it is understood that methodology 400 may be implemented using any other suitable configuration of a test system employing a voltage source, test load and controller suitable for interfacing with a VR controller of multi-phase VR to perform the steps described herein. Further, the disclosed methods and systems may be similarly used to test a multi-phase VR configured with any number of two or more multiple phases, including more than the six phases illustrated in FIG. 2.

As shown in FIG. 4, methodology 400 begins in step 402 with a multi-phase VR 200 and its accompanying PCBA placed in an ICT text fixture 120 as shown in FIG. 1. Next, in step 404, power is applied from voltage source 104 of test system 102 to multi-phase VR 200, and a preset test load 108 is operatively coupled to receive the output voltage 136 from power phases 134. A rotating single phase operation command is then sent in step 406 by test system controller 106 via communication bus 144 (e.g., PMBus or I2C bus) to force VR controller 132 of multi-phase VR 200 to operate in rotating single phase operation mode. In this mode, phase1 (i.e., the first power phase $150_1$) is initially enabled by VR controller 132 to supply output voltage 136 to test load 108 for a preset duration (for example a time period of about 5-10 msec or any other suitable greater or lesser time period, dominated by ICT algorithm computation time given an example where given Vout ramp up and settling time is about 2 msec) in step 408 in order to allow verification that the phase1 operation is correct in step 410. More particularly, in step 410, the phase1 output 136 from VR 200 may be individually measured alone (i.e., phase 1 output is measured separately and independently apart from all other phases of VR 200 which are disabled while phase1 is enabled) using test system sense circuitry, and the phase1 output is individually analyzed by test system controller to determine if the phase 1 output is normal (i.e., meeting preset output voltage criteria). An example of such a phase output criteria is that VR output voltage Vout is regulated at the range of given voltage identification (VID) value +/−5 mV when applied load current is changed from 5A to 20A, although any other phase output criteria may be employed that is suitable for verifying normal output of an individual phase. In this regard, VID represents reference voltage, e.g., usually provided by a CPU by SVID bus, or by host system (e.g., the test system in FIG. 1) via PMBus or I2C.

Still referring to methodology 400, if phase1 output of the first phase $150_1$ is determined to be normal in step 410 (e.g., meeting the pre-determined phase 1 current/voltage criteria), then methodology 400 proceeds to step 412 where phase 1 current sense calibration is individually performed by test system controller 106 for the first phase $150_1$ alone (i.e., calibration is performed on the first phase separately and independently from all other phases $150_2$-$150_3$ of a three-phase VR 200), after VR 200 enters steady-state operation. This phase current sense calibration for an individually enabled phase may be performed in one embodiment by correcting initial current sense gain and offset saved in memory based on analysis and computation of deviation between measured load current by ICT and sensed current by VR controller based on the analyzed separate output from the individually enabled phase. Such memory may be, for example, non-volatile memory or any other suitable memory device that is communicatively coupled to VR controller 132 or any other device on PCBA 130, and that is configured to retain program instructions and/or data for a period of time. For example, the phase 1 current sense calibration may be performed in one exemplary embodiment by performing the following steps of:

1) Reconfigure VR 200 in single phase1 operation mode;
2) Test system applies load current I_ICT1 (e.g., 5A) and VR sensed current is I_out1;
3) Test system applies load current I_ICT2 (e.g., 15A) and VR sensed current is I_out2;
4) Test system completes two major parameters computation for: A) desired gain of VR sense circuit=initial gain (set in GUI non-volatile memory (NVM))*((Iout2−Iout1)/I_ICT2−I_ICT2); and B) offset=I_out1−I_ICT1 or I_out2−I_ICT2; and
5) Write resulted gain and offset to specific register or NVM memory cells.

Following phase1 current sense calibration, methodology 400 proceeds to 414 where phase2 is enabled prior to disabling phase 1. Phase 1 is turned off after a short delay (e.g., about 1 msec), and methodology 400 then proceeds to step 416 which may be conducted as described below. In this way, it can be determined by test system controller 106 if individual phases 1 and 2 are good phases contributing to the output, and current sense calibration may be completed individually by test system controller 106 if each phase is verified to be a correctly operating phase.

As shown in FIG. 4, if the phase1 output of first power phase $150_1$ is found not to be normal in step 410, then methodology 400 alternatively proceeds to step 418, where bad phase information of phase1 is recorded, e.g., in non-volatile memory coupled to test system controller 106. Examples of such bad phase information includes identity of the bad phase, actual current and/or voltage output of first power phase $150_1$ to test load 108, no output voltage or unable to support load current or Vout is out of regulated voltage range, etc. After recording the bad phase information in step 418, methodology 400 proceeds to step 420 where test system controller 106 turns off multi-phase VR 200 and $V_{OUT}$ 136 is discharged to zero. Test system controller 106 then sends another rotating single phase operation command via communication bus 144 to VR controller 132 of multi-phase VR 200. In response to this command, VR 200 is re-enabled with phase 2 output from second power phase $150_2$ to supply output voltage 136 to test load 108 for a preset duration of time in a manner similar to described for phase1 in step 408. It will be understood that this operation of step 416 may be the same whether step 416 is preceded by step 414 or 420. It will be understood that In order to prevent a long Vout discharge time between operation modes, a dummy load may be connected to the PCBA 130 in-between individual phase tests to quickly discharge Vout 136. In this regard, providing a dummy load on the PCBA 130 may not be desirably implementable in some cases, e.g., on blade servers where the PCBA space for VR devices 200 is very tight. In such cases, PCBA real estate may be saved in the VR design if dummy loading may be implemented by the ICT fixture 120.

Next, methodology 400 proceeds to step 422 which is conducted in a manner similar to step 410, but this time the output of phase2 (i.e., the second phase $150_2$) is individually measured alone using test system current sense circuitry 110 and analyzed by test system controller to determine if it the output is normal as previously descried for phase1 in step 410. Then, as shown, steps 424, 430 and 432 are performed for individual phase2 alone in a similar manner as respective steps 412, 418 and 420 were performed using individual phase1 alone. Further steps 426 and 428 are performed using phase 2 and/or phase 3 as appropriate in a similar manner as respective steps 414 and 416 were performed using phase1 and/or 2. Methodology 400 then proceeds and performs steps 434, 436 and 438 for individual phase 3 alone in a manner similar as respective steps 410, 412 and 418 were performed using individual phase1 alone. The above-described process may continue for individually testing output and calibrating any and all additional individual phase/s (e.g., phase 4 and/or greater) that may be optionally present in a given multi-phase VR under test. However, in the exemplary embodiment of FIG. 4, phase 3 (i.e., the third phase $150_3$ of a three-phase VR) is the final phase of the multi-phase VR device under test, and methodology 400 thus proceeds either from steps 436 or 438 to step 440 where multi-stage VR test results are communicated from the test system 102 to the host system (e.g., a notebook computer), and then ICT test system 100 is powered down in step 442. At this time, multi-phase VR 200 and PCBA 130 may be removed from the test fixture 120.

It will be understood that the methodology of FIG. 4 may implemented to complete validation and calibration for all phases of a multi-phase VR device, regardless of the particular number of phases and phases of the multi-phase VR device. It will also be understood that in one possible alternative embodiment, methodology 400 may be independently implemented by the VR digital controller 132 when the VR 200 is being initialized. Furthermore, it will also be understood that the particular steps of methodology 400 are exemplary only, and that any combination of additional and/or alternative steps, and/or any order of the illustrated steps, may be employed that is suitable for identifying one or more bad phases of a multi-phase VR and/or performing current sense calibration for each individual phase of a multi-phase VR device.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. A method of testing a multi-phase voltage regulator (VR) having multiple phases, comprising controlling the multi-phase VR to operate in a rotating single phase operation mode to:
  first individually enable a first one of the multiple phases of the multi-phase VR by itself to produce an output voltage for a duration of time from the individually enabled first phase alone;
  analyze the separate individual output of the individually enabled first phase; and
  at least one of:
    determine if the analyzed separate output from the individually enabled first phase meets a predetermined phase output criteria, or
    perform phase current sense calibration for the individually enabled first phase based on the analyzed separate output from the individually enabled first phase, or
    a combination thereof; and
  then individually enable a second one of the multiple phases of the multi-phase VR by itself to produce an output voltage for a duration of time from the individually enabled second phase alone;
  analyze the separate individual output of the individually enabled second phase; and
  at least one of:
    determine if the analyzed separate output from the individually enabled second phase meets a predetermined phase output criteria, or
    perform phase current sense calibration for the individually enabled second phase based on the analyzed separate output from the individually enabled second phase, or
    a combination thereof.

2. A method of testing a multi-phase voltage regulator (VR) having multiple phases, comprising:
  controlling the multi-phase VR to individually enable each of the multiple phases of the multi-phase VR one at a time to produce an output voltage for a duration of time from each respective individually enabled phase alone;
  analyzing the separate individual output of each one of the individually enabled multiple phases; and
  at least one of:
    determining if the analyzed separate output from each one of the individually enabled phases meets a predetermined phase output criteria, or
    performing phase current sense calibration for each individually enabled phase based on the analyzed separate output from the respective individually enabled phase, or
    a combination thereof.

3. The method of claim 2, where the method comprises determining if the analyzed separate output from each one of the individually enabled phases meets a predetermined phase output criteria.

4. The method of claim 3, where the method comprises:
  first determining if the analyzed separate output from each given one of the individually enabled phases meets a predetermined phase output criteria; and
  then only performing the phase current sense calibration step for the given individually enabled phase if the analyzed separate output from the given one of the individually enabled phases is determined to meet the predetermined phase output criteria.

5. The method of claim 2, where the method comprises performing phase current sense calibration for each individually enabled phase based on the analyzed separate output from the respective individually enabled phase.

6. The method of claim 2, where the method comprises determining if the analyzed separate output from each one of the individually enabled phases meets a predetermined phase output criteria; and performing phase current sense calibration for each individually enabled phase based on the analyzed separate output from the respective individually enabled phase.

7. The method of claim 2, where the controlling step comprises providing digital control signals to a digital VR controller of the multi-phase VR to cause the digital VR controller to produce phase control signals to individually enable each of the multiple phases of the multi-phase VR one at a time to produce an output voltage.

8. The method of claim 2, where the multi-phase VR further comprises a digital VR controller coupled to control each of the multiple phases of the multi-phase VR; and where the method further comprises:
  providing a test system having a test system voltage source, a test system controller different from the digital VR controller;
  providing a test system load;
  temporarily coupling the test system voltage source to provide power to a voltage input of the multiple phases of the multi-phase VR;
  temporarily coupling the test system load to a voltage output of the multiple phases of the multi-phase VR;

temporarily coupling the test system controller to provide test system control signals to the digital VR controller of the multi-phase VR;

then providing power to the voltage input of the multiple phases of the multi-phase VR, and providing test system control signals from the test system controller to the digital VR controller to cause the digital VR controller to control the multi-phase VR to individually enable each of the multiple phases of the multi-phase VR one at a time to produce an output voltage to the test system load for a duration of time from each respective individually enabled phase alone;

then using the test system controller to analyze the separate individual output of each one of the individually enabled multiple phases to at least one of:

determine if the analyzed separate output from each one of the individually enabled phases meets a predetermined phase output criteria, or perform phase current sense calibration for each individually enabled phase based on the analyzed separate output from the respective individually enabled phase, or a combination thereof; and then decoupling each of the test system voltage source, test system controller, and test system load from the multi-phase VR.

9. The method of claim 8, further comprising using the test system controller to generate multi-stage VR test results comprising at least one of information indicative of whether the separate output from each one of the individually enabled phases meets a predetermined phase output criteria, phase current sense calibration information for each individually enabled phase, or a combination thereof; and then communicating the multi-stage VR test results from the test system controller to a test data collection system.

10. The method of claim 8, where components of the multi-phase VR are assembled on a printed circuit board assembly (PCBA); where the test system includes a test fixture configured to receive the PCBA of the multi-phase VR for testing of the individual phases of the multi phase VR; and where the method further comprises:

performing the respective temporarily coupling steps by temporarily assembling the multi-phase VR PCBA to the test fixture to temporarily couple the test system voltage source to provide power through the test fixture to the voltage input of the multiple phases of the multi-phase VR, to temporarily couple the test system load to the voltage output of the multiple phases of the multi-phase VR, and to temporarily couple the test system controller to provide test system control signals through the test fixture to the digital VR controller of the multi-phase VR; and then performing the decoupling step by de-assembling the multi-phase VR PCB from the test fixture to decouple each of the test system voltage source, test system controller, and test system load from the multi-phase VR.

11. A test system configured to test a multi-phase VR having multiple individual phases, the test system comprising:

a test system voltage source configured to be coupled to provide power to a voltage input of the multiple phases of the multi-phase VR;

a test system load configured to be coupled to a voltage output of the multiple phases of the multi-phase VR;

a test system controller configured to be coupled to provide test system control signals to the multi-phase VR;

where the test system controller is configured to provide test system control signals to the multi-phase VR to cause the multi-phase VR to operate in a rotating single phase operation mode to:

first individually enable a first one of the multiple phases of the multi-phase VR by itself to produce an output voltage to the test system load for a duration of time from the individually enabled first phase alone; and where the test system controller is further configured to analyze the individual output of the individually enabled first phase to at least one of:

determine if the analyzed separate output from the individually enabled first phase meets a predetermined phase output criteria, or perform phase current sense calibration for the individually enabled first phase based on the analyzed separate output from the respective individually enabled phase, or a combination thereof; and then individually enable a second one of the multiple phases of the multi-phase VR by itself to produce an output voltage for a duration of time from the individually enabled second phase alone;

analyze the separate individual output of the individually enabled second phase; and at least one of:

determine if the analyzed separate output from the individually enabled second phase meets a predetermined phase output criteria, or perform phase current sense calibration for the individually enabled second phase based on the analyzed separate output from the individually enabled second phase, or a combination thereof.

12. A test system configured to test a multi-phase VR having multiple individual phases, the test system comprising:

a test system voltage source configured to be coupled to provide power to a voltage input of the multiple phases of the multi-phase VR;

a test system load configured to be coupled to a voltage output of the multiple phases of the multi-phase VR;

a test system controller configured to be coupled to provide test system control signals to the multi-phase VR;

where the test system controller is configured to:

provide test system control signals to the multi-phase VR to cause the multi-phase VR to individually enable each of the multiple phases of the multi-phase VR one at a time to produce an output voltage for a duration of time from each respective individually enabled phase alone, analyze the separate individual output of each one of the individually enabled multiple phases, and at least one of:

determine if the analyzed separate output from each one of the individually enabled phases meets a predetermined phase output criteria, or perform phase current sense calibration for each individually enabled phase based on the analyzed separate output from the respective individually enabled phase, or a combination thereof.

13. The system of claim 12, where the test system controller is configured to determine if the analyzed separate output from each one of the individually enabled phases meets a predetermined phase output criteria.

14. The system of claim 13, where the test system controller is configured to:
first determine if the analyzed separate output from each given one of the individually enabled phases meets a predetermined phase output criteria; and
then only perform the phase current sense calibration step for the given individually enabled phase if the analyzed separate output from the given one of the individually enabled phases is determined to meet the predetermined phase output criteria.

15. The system of claim 12, where the test system controller is configured to perform phase current sense calibration for each individually enabled phase based on the analyzed separate output from the respective individually enabled phase.

16. The system of claim 12, where the test system controller is configured to determine if the analyzed separate output from each one of the individually enabled phases meets a predetermined phase output criteria; and to perform phase current sense calibration for each individually enabled phase based on the analyzed separate output from the respective individually enabled phase.

17. The system of claim 12, where the test system controller is configured to be coupled to provide digital control signals to a digital VR controller of the multi-phase VR to cause the digital VR controller to produce phase control signals to individually enable each of the multiple phases of the multi-phase VR one at a time to produce an output voltage.

18. The system of claim 12, where the test system controller is different from a VR controller of the multi-phase VR and is configured to be temporarily coupled to provide test system control signals to a digital VR controller of the multi-phase VR that itself is coupled to control each of the multiple phases of the multi-phase VR and to be decoupled from the multi-phase VR after testing; where the test system voltage source is configured to be temporarily coupled to provide power to a voltage input of the multiple phases of the multi-phase VR and to be decoupled from the voltage input after testing; where the test system load is configured to be temporarily coupled to a voltage output of the multiple phases of the multi-phase VR and to be decoupled from the voltage output after testing; and where the test system controller is further configured to:
provide test system control signals to the digital VR controller to cause the digital VR controller to control the multi-phase VR to individually enable each of the multiple phases of the multi-phase VR one at a time to produce an output voltage to the test system load for a duration of time from each respective individually enabled phase alone; and
analyze the separate individual output of each one of the individually enabled multiple phases to at least one of:
determine if the analyzed separate output from each one of the individually enabled phases meets a predetermined phase output criteria, or
perform phase current sense calibration for each individually enabled phase based on the analyzed separate output from the respective individually enabled phase, or
a combination thereof 19. The system of claim 18, where the test system controller is further configured to:
generate multi-stage VR test results comprising at least one of information indicative of whether the separate output from each one of the individually enabled phases meets a predetermined phase output criteria, phase current sense calibration information for each individually enabled phase, or a combination thereof; and
then to communicate the multi-stage VR test results from the test system controller to a test data collection system.

20. The system of claim 18, where components of the multi-phase VR are assembled on a printed circuit board assembly (PCBA); and where the test system includes a test fixture configured to temporarily receive the PCBA of the multi-phase VR to:
temporarily couple the test system voltage source to provide power through the test fixture to the voltage input of the multiple phases of the multi-phase VR,
temporarily couple the test system load through the test fixture to the voltage output of the multiple phases of the multi-phase VR, and
temporarily couple the test system controller to provide test system control signals through the test fixture to the digital VR controller of the multi-phase VR.

* * * * *